United States Patent
Lee et al.

(10) Patent No.: US 7,965,250 B2
(45) Date of Patent: Jun. 21, 2011

(54) MICROWAVE LENS

(75) Inventors: Jae Seung Lee, Ann Arbor, MI (US); Serdar H. Yonak, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 285 days.

(21) Appl. No.: 12/244,297

(22) Filed: Oct. 2, 2008

(65) Prior Publication Data

US 2010/0085134 A1    Apr. 8, 2010

(51) Int. Cl.
*H01Q 19/06* (2006.01)
*H01Q 1/38* (2006.01)

(52) U.S. Cl. .................... 343/753; 343/700 MS

(58) Field of Classification Search ........... 343/700 MS, 343/753, 754, 745, 749; 334/14
See application file for complete search history.

(56) References Cited

U.S. PATENT DOCUMENTS

| | | | |
|---|---|---|---|
| 7,228,156 B2 | 6/2007 | Gilbert | |
| 7,358,915 B2 | 4/2008 | Legay et al. | |
| 7,525,711 B1 * | 4/2009 | Rule et al. | 359/244 |
| 7,570,432 B1 * | 8/2009 | Yonak | 359/652 |
| 7,764,232 B2 * | 7/2010 | Achour et al. | 343/700 MS |
| 2005/0168391 A1 | 8/2005 | Ratajczak et al. | |
| 2008/0136563 A1 | 6/2008 | Duwel et al. | |
| 2008/0143621 A1 | 6/2008 | Diaz et al. | |
| 2008/0165079 A1 | 7/2008 | Smith et al. | |
| 2009/0096545 A1 * | 4/2009 | O'Hara et al. | 332/129 |
| 2009/0206963 A1 * | 8/2009 | Nguyen et al. | 334/14 |

OTHER PUBLICATIONS

Tao et al., Dynamical Contol of Terahertz Metamaterial Resonance Response Using Bimaterial Cantilevers, PIERS Proceedings, Cambridge, USA, Jul. 2-6, 2008 pp. 870-873.
Chicherin et al., MEMS-Based High-Impedance Surfaces for Millimeter and Submillimeter Wave Applications, Microwave and Optical Technology Letters/ vol. 48, No. 12, Dec. 2006. pp. 2570-2573.
Gil et al., Tunable Stop-Band Filter at Q-Band Based on RF-MEMS Metamaterials, Electronic Letters, Oct. 11, 2007, vol. 42 No. 21.
Hand et al., Characterization of Tunable Metamaterial Elements Using MEMS Switches, IEE Antennas and Wireless Propagation Letters, vol. 6, 2007. pp. 401-404.

* cited by examiner

*Primary Examiner* — Hoang V Nguyen
(74) *Attorney, Agent, or Firm* — Gifford, Krass, Sprinkle, Anderson & Citokowski, P.C.

(57) ABSTRACT

A microwave lens having an array of electronic inductive capacitive cells wherein each cell includes an electrically conductive pattern which responds to incident microwave electromagnetic energy as an LC resonator. At least one of the cells includes at least one MEMS device which is movable in response to an electrical bias to thereby vary the resonant frequency of that cell. In order to bias the MEMS device, an electrical insulating layer extends along a portion of the pattern of the cell and to both sides of the MEMS device. An electrically conductive strip then extends over the insulating layer so that the conductive strip is electrically insulated from the pattern while electrically connected to the MEMS device.

5 Claims, 2 Drawing Sheets

MICROWAVE LENS

BACKGROUND OF THE INVENTION

I. Field of the Invention

The present invention relates generally to microwave lenses and, more particularly, to a microwave lens constructed of a metamaterial and with a MEMS device to vary the resonant frequency of the lens.

II. Description of Related Art

The use of metamaterial in microwave applications, such as automotive radar systems, continues to expand. Such metamaterials exhibit properties in response to incident electromagnetic radiation which vary as a function of the shape of the metamaterial rather than the composition of the metamaterial.

Conventionally, the metamaterial comprises a plurality of inductor-capacitor (LC) cells that are arranged in an array. Often the array is planar and a plurality of arrays are stacked one upon each other to form the microwave lens.

Each cell in the array forms an LC resonator which resonates in response to incident electromagnetic radiation at frequencies which vary as a function of the shape of the LC cell. As such, the microwave lens may be utilized to focus, defocus, steer or otherwise control a beam of microwave electromagnetic radiation directed through the lens.

One disadvantage of the previously known microwave lenses using metamaterials, however, is that the resonant frequency of the metamaterial, and thus of the lens, is fixed. In many situations, however, it would be useful to vary the resonant frequency of the lens.

SUMMARY OF THE PRESENT INVENTION

The present invention provides a microwave lens which overcomes the above-mentioned disadvantages of the previously known lenses.

In brief the microwave lens of the present invention comprises a plurality of cells, each of which forms an electronic inductive capacitive (ELC) resonator having its own resonant frequency. The resonator cells are arranged in an array, typically a planar array, and typically multiple arrays of resonator cells are stacked together to form the lens.

Each resonator cell includes a substantially nonconductive substrate as well as a conductive pattern on the substrate. That conductive pattern is arranged to respond to incident microwave radiation as an LC resonant circuit. At the resonant frequency, the resonator cell is substantially opaque to the incident radiation, but passes the radiation at a frequency offset from its resonant frequency.

Each resonator cell has three electrically conductive legs which are spaced apart and generally parallel to each other, thus forming a central leg and two side legs. The side legs may be configured as a capacitor at the resonant frequency and the central leg configured as an inductor, or vice versa. In either event, the value of the capacitive and inductive legs of the resonator cell determines the index of refraction of that cell, and thus the resonant frequency of the resonator cell.

A microelectromechanical (MEMS) device is associated with at least one leg of at least one resonator cell in the array and, more typically, each resonator cell in the array includes at least one MEMS device. The MEMS device is movable between two positions in response to an electrical bias to vary the index of refraction of that cell and thus the resonant frequency of that cell. For example, a MEMS device may be associated with both of the side legs of the cell and/or the central leg of the cell pattern.

In order to selectively provide the electrical bias to the MEMS device, a layer of insulating material, such as polysilicon, is provided along at least a portion of the resonant cell pattern so that the polysilicon extends up to both sides of the MEMS device. Thereafter, a conductive strip is placed over the insulating material so that the conductive strip is insulated from the pattern of the resonant cell, but is electrically connected to the MEMS device. A separate conductive strip is connected to each side of the MEMS device. Consequently, the MEMS device may be actuated by the application of the appropriate bias voltage to the conductive strips to vary the resonant frequency of the resonator cell as desired.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
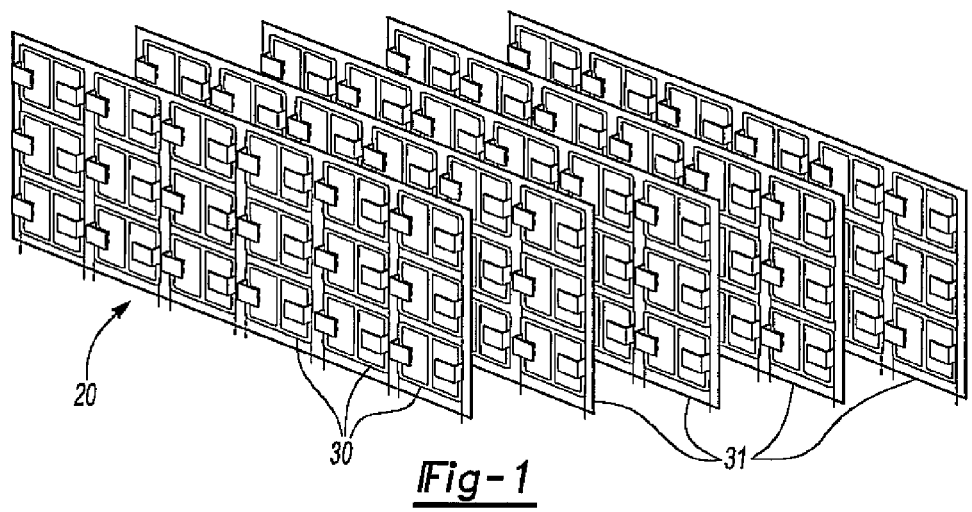
FIG. 1 is an exploded elevational view illustrating a preferred embodiment of the microwave lens of the present invention.

With reference first to FIG. 1, a microwave lens 20 is shown which comprises a plurality of electronic inductive capacitive (ELC) resonator cells 30. These cells are arranged in a planar array 31. Each array, furthermore, is illustrated in FIG. 1 as being rectangular in shape, although other shapes may be utilized without deviation from the spirit or scope of the invention.

Although a single planar array 31 may be used to form the microwave lens, more typically a plurality of planar arrays 31 are stacked on top of each other to form the lens.

Figure 2:
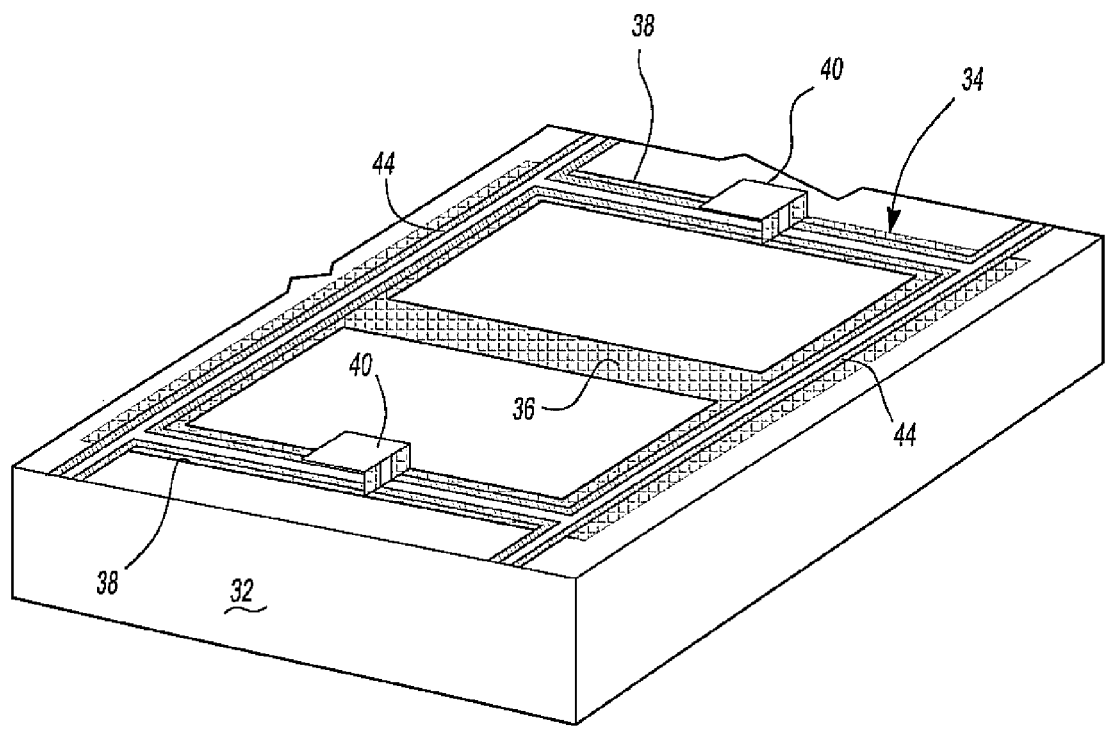
FIG. 2 is an elevational view of a single resonator cell.

With reference now particularly to FIG. 2, a single resonator cell 30 is illustrated. The resonator cell 30 includes a substrate 32 made of an electrical insulating material. A conductive pattern 34 is then formed on the substrate 32 using conventional manufacturing techniques.

Figure 3:
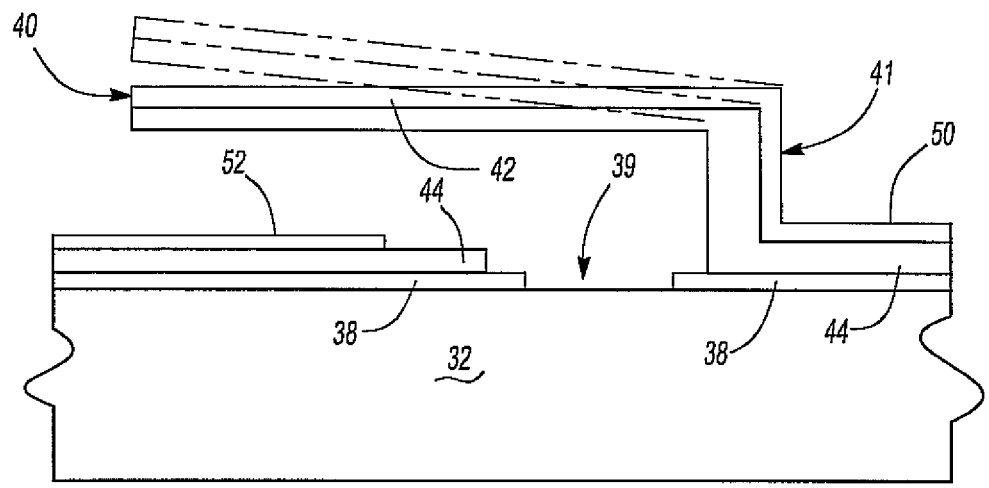
FIG. 3 is an end view of one MEMS device on a resonator cell and enlarged for clarity.

The pattern 34 includes a central leg 36 and two side legs 38 which are spaced apart and generally parallel to each other. The pattern of the resonator cell 30 thus forms an inductor-capacitor (LC) resonator at the resonant microwave frequency. For example, as shown in FIG. 2, the central leg 36 is configured as an inductor while the side legs 38 are configured as capacitors. Consequently, as shown in FIG. 3, the side legs 38 include a discontinuity 39 along their length and preferably at the center of each such leg 38. It will be understood, of course, that the opposite may also be true, i.e. that the central leg 36 be configured as a capacitor and the side legs 38 configured as an inductor In order to vary the refractive index of the cell 30, and thus the resonant frequency of the cell, at least one microelectromechanical (MEMS) device is associated with at least one, and more typically all, of the resonator cells 30 in the array 31. For example, as shown in FIG. 2, one MEMS device 40 is associated with each of the side legs 38 of each resonator cell 30.

With reference now to FIG. 3, one MEMS device 40 is there shown greatly enlarged. The MEMS device 40 is made of an electrically conductive material and includes a base 41 and a cantilever portion 42 which extends over the discontinuity 39 of the side leg 38. The MEMS device 40 is movable in response to an electrical bias between the position shown in phantom line and the position shown in solid line in FIG. 3. Since the MEMS device 40 is positioned over the discontinuity 39 on the side leg 38 of the resonator cell 30, movement of the MEMS device 40 through the application of a bias voltage across the MEMS device 40 varies the capacitance of the side leg 38 of the cell pattern and thus varies the resonant frequency of the resonant cell 30.

Figure 4:
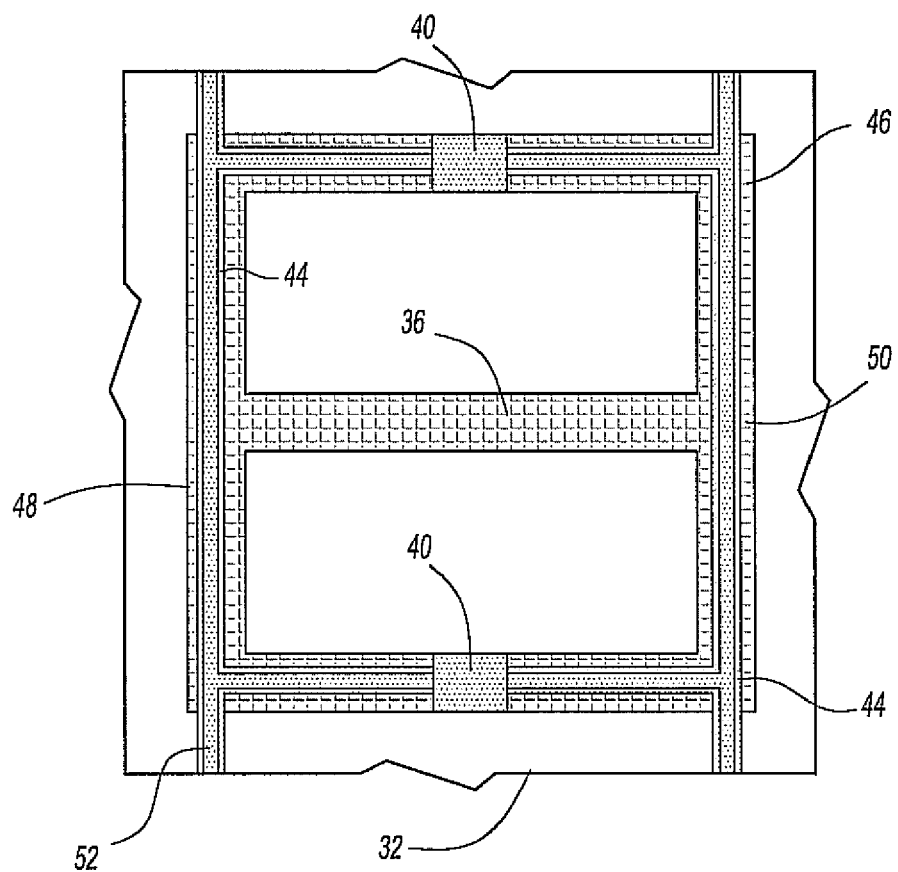
FIG. 4 is a plan view illustrating one resonator cell of the lens of the present invention.

With reference now to FIGS. 3 and 4, in order to electrically connect the MEMS device 40 to a source of electrical bias, at least a portion of the cell conductive pattern is covered with a layer 44 of an electrical insulating material, such as polysilicon, so that the layer 44 of insulating material extends up to the MEMS device 40 as well as along the underside of the cantilever portion 42 of the MEMS device 40. For example, as shown in FIG. 4, the insulating layer 44 extends entirely along one end leg 46 of the cell pattern and also from the end leg 46 to the MEMS device 40. Similarly, a like insulating layer 44 is provided on the other leg 48 of the cell pattern as well as along the side legs 38 to the other side of the MEMS device 40.

Thereafter, an electrically conductive strip 50 extends over the insulating layer 44 along the end leg 46 of the conductive pattern 34 and to one side of each MEMS device 40. In doing so, the electrically conductive strip 50 is electrically insulated from the pattern of the resonator cell 30, but electrically connected to one side, i.e. the cantilever portion 42, of the MEMS devices 40.

Similarly, a second electrically conductive strip 52 is placed over the top of the insulating layer 44 along the other side 48 of the conductive pattern 34 and so that the second strip 52 extends to the other side of tie MEMS device 40. As such, the conductive strip 52 is electrically insulated from the pattern of the resonator cell 30.

The two conductive strips 50 and 52 enable actuation of the MEMS device 40 by the application of the appropriate amount of voltage bias between the conductive strips 52 and 50.

Although electrically conductive strips 52 and 50 for a single resonator cell 30 are illustrated in FIG. 4, it will be understood, of course, that the conductive strips 50 and 52 extend along a plurality of cells in the array 31. As such, all of the resonator cells 30 in the array 31 which contain the MEMS devices 40 may be simultaneously actuated by applying a voltage bias thus varying the resonant frequency of the lens.

In practice, it has been found that routing the electrically conductive strips 50 and 52 for the MEMS device 40 directly over the conductive pattern of the resonator cell 30 while insulating the conductive strips 50 and 52 from the cell pattern has little, if any, effect on the resonant frequency of the resonator cells 30.

From the foregoing, it can be seen that the present invention provides a simple yet effective microwave lens with MEMS devices to change the resonant frequency of the microwave lens. Having described our invention, however, many modifications thereto will become apparent to those skilled in the art to which it pertains without deviation from the spirit of the invention as defined by the scope of the appended claims.

We claim:

1. A metamaterial microwave lens comprising:
   an array of electronic inductive capacitive cells, each cell having an electrically conductive pattern which responds to incident microwave electromagnetic energy as an LC resonator, said electrically conductive pattern disposed on a substrate,
   at least one of said cells including at least one MEMS device having two sides and movable in response to an electrical bias between at least two positions to thereby vary the resonant frequency of said at least one cell,
   an electrical insulating layer extending along and over only a portion of said pattern of said at least one cell, said insulating layer extending to said MEMS device,
   an electrically conductive strip extending over said insulating layer such that said conductive strip is electrically insulated from said pattern, the sides of said conductive strip being spaced inwardly from sides of said pattern so that said conductive strips overlie only a portion of said pattern, said conductive strip being electrically connected to said sides of said MEMS device and said insulating layer being sandwiched between said conductive strip and said conductive pattern.

2. The invention as defined in claim 1 wherein said electrical insulating material comprises polysilicon.

3. The invention as defined in claim 1 wherein said pattern of said at least one cell comprises a central inductive leg and two side capacitive legs spaced from said inductive leg and wherein one said MEMS device is associated with each capacitive leg.

4. The invention as defined in claim 3 wherein each said MEMS device comprises a cantilever conductor which, upon actuation, varies the capacitance of the side legs.

5. The invention as defined in claim 1 wherein a plurality of cells in said array include at least one MEMS device.

* * * * *

UNITED STATES PATENT AND TRADEMARK OFFICE
CERTIFICATE OF CORRECTION

| | | |
|---|---|---|
| PATENT NO. | : 7,965,250 B2 | Page 1 of 1 |
| APPLICATION NO. | : 12/244297 | |
| DATED | : June 21, 2011 | |
| INVENTOR(S) | : Jae Seung Lee et al. | |

It is certified that error appears in the above-identified patent and that said Letters Patent is hereby corrected as shown below:

Column 2 Line 60, Replace "inductor" with --inductor.--

Signed and Sealed this

Thirteenth Day of December, 2011

David J. Kappos
*Director of the United States Patent and Trademark Office*